United States Patent
Shinagawa et al.

(10) Patent No.: US 11,669,079 B2
(45) Date of Patent: Jun. 6, 2023

(54) TOOL HEALTH MONITORING AND CLASSIFICATIONS WITH VIRTUAL METROLOGY AND INCOMING WAFER MONITORING ENHANCEMENTS

(71) Applicant: Tokyo Electron Limited, Tokyo (JP)

(72) Inventors: Jun Shinagawa, Fremont, CA (US); Toshihiro Kitao, Austin, TX (US); Hiroshi Nagahata, Miyagi (JP); Chungjong Lee, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/373,078

(22) Filed: Jul. 12, 2021

(65) Prior Publication Data
US 2023/0009419 A1 Jan. 12, 2023

(51) Int. Cl.
*G05B 19/418* (2006.01)
*H01L 21/66* (2006.01)
*H05H 1/46* (2006.01)

(52) U.S. Cl.
CPC ........ *G05B 19/41875* (2013.01); *H01L 22/12* (2013.01); *H05H 1/46* (2013.01); *G05B 2219/45031* (2013.01)

(58) Field of Classification Search
None
See application file for complete search history.

(56) References Cited

U.S. PATENT DOCUMENTS

| | | | | |
|---|---|---|---|---|
| 5,923,553 A * | 7/1999 | Yi | ............... | G05B 19/41875 700/121 |
| 8,233,494 B2 * | 7/2012 | Amini | ............. | G05B 19/41875 370/408 |
| 8,339,595 B2 * | 12/2012 | Den Boef | ............. | G03F 7/7015 356/237.5 |
| 9,087,176 B1 * | 7/2015 | Chang | ............. | G03F 7/705 |
| 9,116,442 B2 * | 8/2015 | Adel | ............. | G03F 7/70616 |
| 10,734,293 B2 * | 8/2020 | David | ............. | H01L 22/14 |
| 10,795,346 B2 * | 10/2020 | Yennie | ............. | G06N 3/084 |
| 2009/0228129 A1 * | 9/2009 | Moyne | ............. | G06Q 10/06 706/47 |
| 2011/0013175 A1 * | 1/2011 | Davis | ............. | G03F 7/70625 356/326 |
| 2014/0222376 A1 * | 8/2014 | Kao | ............. | G05B 19/41875 702/182 |

(Continued)

FOREIGN PATENT DOCUMENTS

JP 2007250755 A * 9/2007 ........ H01J 37/32082

*Primary Examiner* — Jason Lin
(74) *Attorney, Agent, or Firm* — Oblon, McClelland, Maier & Neustadt, L.L.P.

(57) ABSTRACT

A method of evaluating tool health of a plasma tool is provided. The method includes providing a virtual metrology (VM) model that predicts a wafer characteristic based on parameters measured by module sensors and in-situ sensors of the plasma tool. A classification model is provided that identifies a plurality of failure modes of the plasma tool. An initial test is performed on an incoming wafer to determine whether the incoming wafer meets a preset requirement. The wafer characteristic is predicted using the VM model when the incoming wafer meets the preset requirement. A current failure mode is identified using the classification model when the wafer characteristic predicted by using the VM model is outside a pre-determined range.

21 Claims, 5 Drawing Sheets

(56) References Cited

U.S. PATENT DOCUMENTS

| | | | | |
|---|---|---|---|---|
| 2018/0082826 A1* | 3/2018 | Guha | ................ | H01L 21/67248 |
| 2018/0356807 A1* | 12/2018 | Honda | ............. | G05B 19/41885 |
| 2019/0049937 A1* | 2/2019 | Tetiker | ................ | H01L 21/3065 |
| 2020/0004159 A1* | 1/2020 | Yeh | ........................ | H05G 2/008 |
| 2020/0226742 A1* | 7/2020 | Sawlani | ................ | G06T 7/0004 |

* cited by examiner

TOOL HEALTH MONITORING AND CLASSIFICATIONS WITH VIRTUAL METROLOGY AND INCOMING WAFER MONITORING ENHANCEMENTS

FIELD OF THE INVENTION

This disclosure relates to semiconductor fabrication and, more particularly, to evaluating tool health of a plasma tool.

BACKGROUND

Plasma processing plays a vital role in material deposition and removal in the production of semiconductor chips. Typical examples include plasma-assisted chemical vapor deposition, plasma-assisted physical vapor deposition, plasma etching, plasma cleaning, etc. In a plasma process, a remote plasma source generates an ionized gas which contains ions, electrons, radicals and neutral particles. Precise control of the ionized gas in a plasma chamber is crucial in ensuring that products of the plasma process meet their specifications. Defective products that do not conform to such specifications reduce the productivity and profitability of a semiconductor manufacturing facility.

Defective products can result from a variety of potential problems so it can be challenging and time-consuming to identify the exact source(s) of a given defect. One common and important source of various defects is related to tool health of plasma tools. Tool conditions typically change or drift over time, and even the slightest change in a critical parameter can sometimes lead to highly undesirable economic results. Meanwhile, small changes can easily occur in many aspects of a plasma tool, such as wafer chuck temperature, plasma gas pressure, etch gas composition, chamber wall stickiness and the like.

SUMMARY

The present disclosure relates to a method of evaluating tool health of a plasma tool.

An aspect (1) includes a method of evaluating tool health of a plasma tool. The method includes providing a virtual metrology (VM) model that predicts a wafer characteristic based on parameters measured by module sensors and in-situ sensors of the plasma tool. A classification model is provided that identifies a plurality of failure modes of the plasma tool. An initial test is performed on an incoming wafer to determine whether the incoming wafer meets a preset requirement. The wafer characteristic is predicted using the VM model when the incoming wafer meets the preset requirement. A current failure mode is identified using the classification model when the wafer characteristic predicted by using the VM model is outside a pre-determined range.

An aspect (2) includes the method of aspect (1), wherein providing the classification model includes determining predictor parameters. Collinearity is removed among the predictor parameters to obtain key predictor parameters. A subset of the key predictor parameters is selected based on relevance to the plurality of failure modes, and the classification model is built using the subset of the key predictor parameters.

An aspect (3) includes the method of aspect (2), wherein determining the predictor parameters includes determining target wafer characteristics. Failure modes are determined for the target wafer characteristics based on occurrence and sensitivity of the failure modes so that the parameters from the module sensors and the in-situ sensors are classified into different categories for the failure modes.

An aspect (4) includes the method of aspect (3), wherein a fault detection model can be constructed with one or more parameters from the module sensors without using parameters from the in-situ sensors. The one or more parameters from the module sensors are added to a first subgroup of predictor parameters.

An aspect (5) includes the method of aspect (4), wherein building a fault detection model entails using one or more parameters from the in-situ sensors. The one or more parameters from the in-situ sensors are added to a second subgroup of predictor parameters.

An aspect (6) includes the method of aspect (5), wherein determining the predictor parameters further includes obtaining a third subgroup of predictor parameters by processing the parameters from the module sensors and the in-situ sensors using domain knowledge including knowledge of the plasma tool, a plasma process associated with the plasma tool, metrology and/or the wafer. The third subgroup of predictor parameters is processed to remove error and variance.

An aspect (7) includes the method of aspect (5), further including building a VM model associated with a failure mode using the second subgroup of predictor parameters.

An aspect (8) includes the method of aspect (5), wherein the classification model includes a plurality of fault detection models.

An aspect (9) includes the method of aspect (5), further including integrating a plurality of fault detection models into a single multi-class classification model by applying a machine learning algorithm.

An aspect (10) includes the method of aspect (2), wherein providing the classification model using the subset of the key predictor parameters includes regression analysis that includes at least one of a logistic regression, a support vector machine regression, a decision tree regression or a linear regression.

An aspect (11) includes the method of aspect (1), wherein performing the initial test includes measuring a reflectivity of the incoming wafer. A test model is provided that predicts the wafer characteristic based on the reflectivity. The wafer characteristic is predicted by using the test model.

An aspect (12) includes the method of aspect (11), wherein the incoming wafer meets the preset requirement when the wafer characteristic predicted by using the test model is within a preset range.

An aspect (13) includes the method of aspect (1), wherein the current failure mode allows for a process control. A recipe is adjusted for the plasma tool.

An aspect (14) includes the method of aspect (13), wherein the current failure mode includes a worn part of the plasma tool.

An aspect (15) includes the method of aspect (1), wherein the current failure mode does not allow for a process control. A corrective action is taken.

An aspect (16) includes the method of aspect (15), wherein the failure mode includes deposition on a chamber wall, and the corrective action includes seasoning to reset the chamber.

An aspect (17) includes the method of aspect (15), wherein the failure mode includes radio frequency (RF) generator power output, and the corrective action includes RF generator service.

An aspect (18) includes the method of aspect (1), wherein the module sensors include at least one of a pressure manometer, a gas flow meter or RF power meter.

An aspect (19) includes the method of aspect (1), wherein the in-situ sensors include at least one of a reflectometer, a plasma sensor, an RF sensor or a voltage and current (VI) sensor.

An aspect (20) includes the method of aspect (1), wherein the predicted wafer characteristic is within the pre-determined range so that no current failure mode exists. The method further includes continuing to process a new wafer.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in the Background, many defects are related to tool health of a plasma tool. Therefore, a plasma tool often requires constant monitoring and correction to maintain the "health" of the plasma tool. Nevertheless, conventional statistical monitoring of individual module sensor parameters in plasma process tools are not sufficient in terms of monitoring the "health" of plasma process tool when the plasma tool health is ultimately defined by users' device yield and throughput specifications. In other words, the tool is deemed healthy if processed wafers yield operational devices within given throughput specifications. The yield and throughputs are most often monitored by post-process or ex-situ metrology measurements of wafer properties with high impacts on the yield, such as critical dimensions (CDs), particles and defects, which in turn define the tool health.

Moreover, statistics-based fault detection and classification (FDC) system in plasma process tool often lacks direct physical linkages between module sensor parameters and process results impacting users' device yield and throughput specifications. Specifically, statistics-based classification models tend to lack accuracy in identifying failure modes in post-fault detection due to insufficient information extracted from module sensor parameters to link module sensor signal features to failure modes. Also, statistics-based classification models tend to lack accuracy in identifying failure modes in post-fault detection due to an insufficient amount of data required for desired accuracies.

In our previous patent application U.S. Ser. No. 17/025,651 titled "Virtual Metrology for Wafer Result Prediction", a method for building a virtual metrology (VM) model that integrates domain knowledge into model building is described. Domain knowledge can, for example, include knowledge of a semiconductor process, a semiconductor tool, a wafer and the like. Domain knowledge can include prior knowledge from literature, common knowledge within a plasma industry/academia, professional knowledge of a plasma expert and the like. In the patent application U.S. Ser. No. 17/025,651, domain knowledge is inserted into feature extraction, collinearity removal and feature selection steps to alleviate the ambiguities in predictor importance defined by statistical methods. Ergo, the method disclosed therein is no longer a "black box approach". Moreover, the disclosed method can build a VM model with the least number of predictors to achieve high accuracy while preserving interpretabilities for deep root cause analysis.

Further, a method for building a VM model that integrates chamber conditions and plasma parameters is disclosed in our patent application titled "Virtual Metrology Enhanced Process Optimization Method" U.S. application Ser. No. 17/350,439, the entire content of which is incorporated herein by reference. Therein, a wafer profile or characteristic is estimated by a VM model with measured plasma parameters. The VM model can be constructed, for example, with a physics model such as a surface reaction model. Very importantly, chamber conditions are described by plasma parameters which are directly measured by in-situ sensors in a plasma chamber. Hence, chamber conditions are integrated into the VM model. In addition, only a relatively small sample size is required.

In the present disclosure, tool health monitoring is enabled by a VM model that predicts relevant metrology values using data collected by both in-situ sensors and module sensors. The VM is utilized to define tool health. Particularly, typical examples of the module sensors include a pressure manometer, a gas flow meter, a radio frequency (RF) power meter and the like while common examples of the in-situ sensors include a reflectometer, a plasma sensor such as an optical emission spectroscopy (OES) sensor, an RF sensor or a voltage and current (VI) sensor.

Techniques herein also include a classification model which can be an ensemble of models for failure modes or a single multi-class model for all the failure modes. That is, the classification model can be used to identify the failure modes of the plasma tool when a fault occurs. Further, because the model input consist of both module sensor and in-situ sensor data, in-situ sensor data are used to identify the failure modes that cannot be directly monitored by module sensor data. For example, a first failure mode that is associated with RF power measurement for an RF generator can be identified directly with module sensor data while a second failure mode that is related to chamber wall condition variations cannot be identified with module sensor data alone. Thus, in-situ sensor data will be used to help identify the second failure mode.

Techniques herein further include performing an initial test on an incoming wafer. The initial test evaluates whether the incoming wafer deviates from average wafers in certain important aspects. The initial test can also be used to investigate how incoming wafer variations affect product outputs. For example, as part of the classification, an incoming wafer is monitored by a reflectometer to study incoming wafer variation impacts on VM output. It can also be used to tune recipe parameters to reduce output wafer CD/ER variations, where CD and ER refer to a critical dimension and an etch rate of an etching process, respectively.

Figure 1:
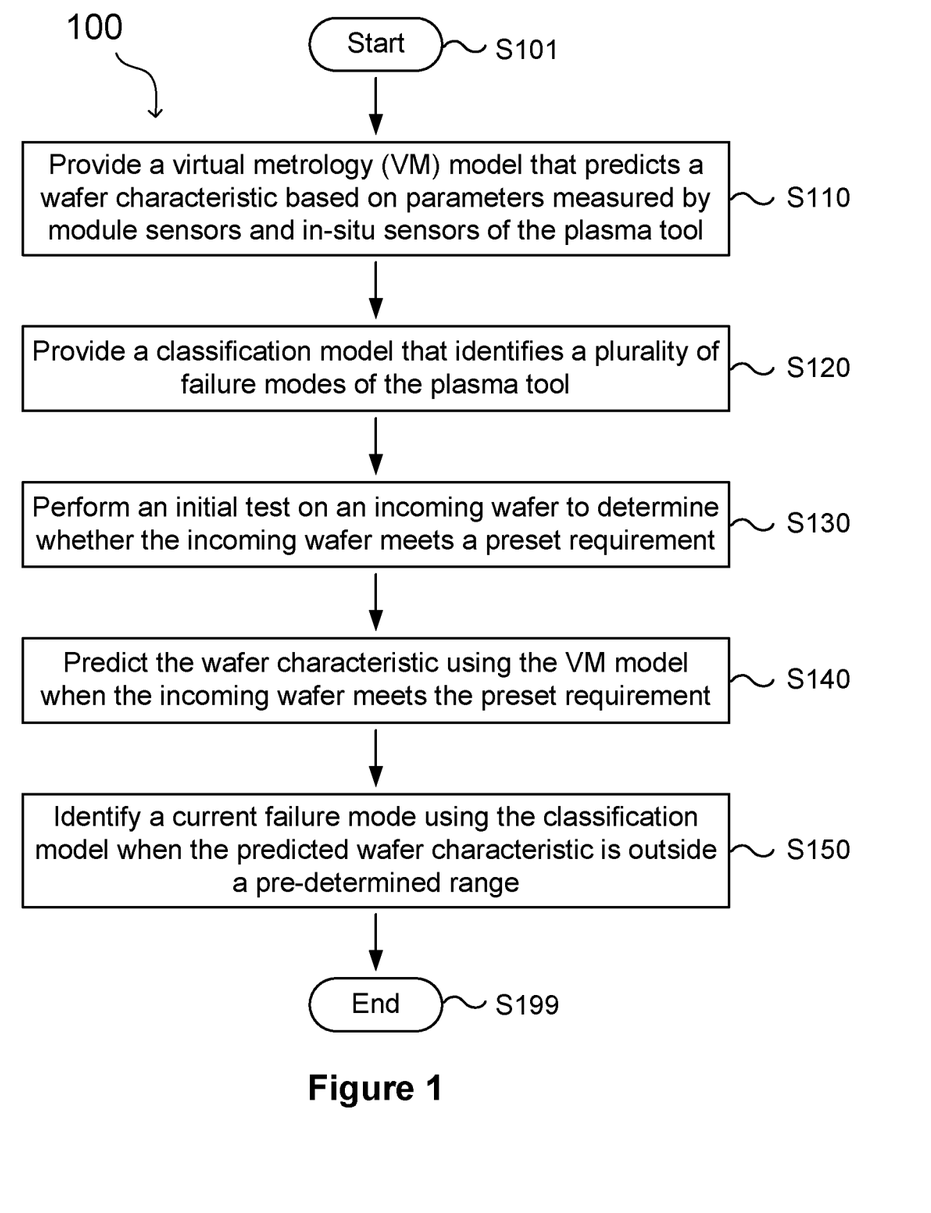
FIG. 1 shows a flow chart of a process for evaluating tool health of a plasma tool, in accordance with exemplary embodiments of the present disclosure.

FIG. 1 shows a flow chart of a process 100 for evaluating tool health of a plasma tool, in accordance with exemplary embodiments of the present disclosure. The process 100 starts with Step S110 by providing a virtual metrology (VM) model that predicts a wafer characteristic based on parameters measured by module sensors and in-situ sensors of the plasma tool. The VM model is also used for defining the tool health. In a non-limiting example, the module sensors include at least one of a pressure manometer, a gas flow meter, an RF power meter. The in-situ sensors include at least one of a reflectometer, a plasma sensor such as an OES sensor, an RF sensor or a VI sensor. The VM model can be obtained from a third party or built by oneself. In some embodiments, the VM model is built using the methods described in our patent applications cited above. At Step S120, a classification model is provided that identifies a plurality of failure modes of the plasma tool. Similarly, the classification model can be obtained from a third party or built by oneself. Details regarding how to build the classification model will be explained in FIGS. 2 and 3.

The process 100 then proceeds to Step S130 where an initial test is performed on an incoming wafer to determine whether the incoming wafer meets a preset requirement. In one embodiment where the incoming wafer does not meet the preset requirement, an alarm is posted about incoming wafer variations. In another embodiment, the incoming wafer meets the preset requirement so Step S140 is executed where the wafer characteristic is then predicted using the VM model.

Subsequently, when the predicted wafer characteristic is within a pre-determined range, no problem is detected. Users may report no problem or move forward to another wafer. When the predicted wafer characteristic is outside the pre-determined range, the process 100 proceeds to Step S150 where a current failure mode is identified using the classification model. In some embodiments, further corrective actions may be taken depending on the current failure mode.

Figure 2:
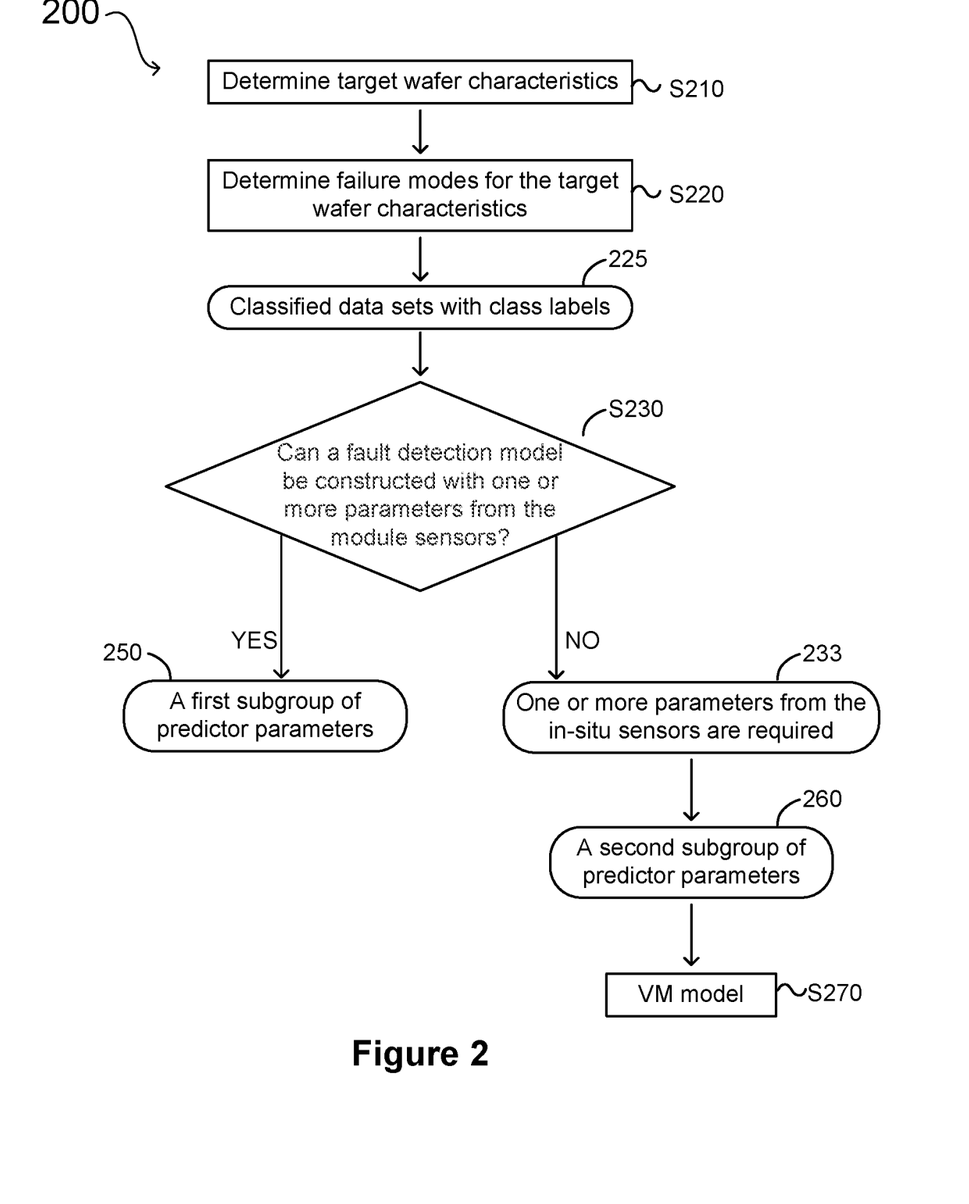
FIG. 2 shows a diagram of extracting parameters for building a classification model, in accordance with exemplary embodiments of the present disclosure.

FIG. 2 shows a diagram of extracting parameters for building a classification model, in accordance with exemplary embodiments of the present disclosure. As shown, at Step S210, target wafer characteristics are determined. In a non-limiting example, a plasma etching process is executed in a plasma tool. Accordingly, the target wafer characteristics can include a critical dimension (CD), an etch rate (ER), particles, defects and/or the like.

At Step S220, failure modes for the target wafer characteristics are determined. In some embodiments, the most probable failure modes for each target wafer characteristic are listed based on occurrence and sensitivity of the failure modes. And data sets collected by module sensors and in-situ sensors of the plasma tool are classified into different categories for the failure modes and assigned class labels (or failure model labels), which include CD excursions, skewed DOE data (artificial failures), worn parts, chamber wall data, etc. As a result, classified data sets with class labels 225 are obtained. In one example, data sets associated with RF power delivery, gas flow and surface reactions are classified into a same category and labeled as "worn parts" or "parts' wear". In another example, data sets associated with wall temperature, wall deposition and water content are classified into a same category and labeled as "chamber wall". As can be understood, some data sets can be labeled as "calibration", "sensor errors" or "wafer temperature".

Subsequently at Step S230, whether a fault detection model can be constructed with one or more parameters from the module sensors is determined. If a fault detection model can be constructed with one or more parameters from the module sensors, that is, no parameter from the in-situ sensors is required, the one or more parameters from the module sensors are added to a first subgroup of predictor parameters 250. If a fault detection model cannot be constructed with one or more parameters from the module sensors, that is, if one or more parameters from the in-situ sensors are required, the one or more parameters from the in-situ sensors are added to a second subgroup of predictor parameters 260. In some embodiments, a VM model that is associated with one or more failure modes are constructed with the second subgroup of predictor parameters 260 at Step S270.

Figure 3:
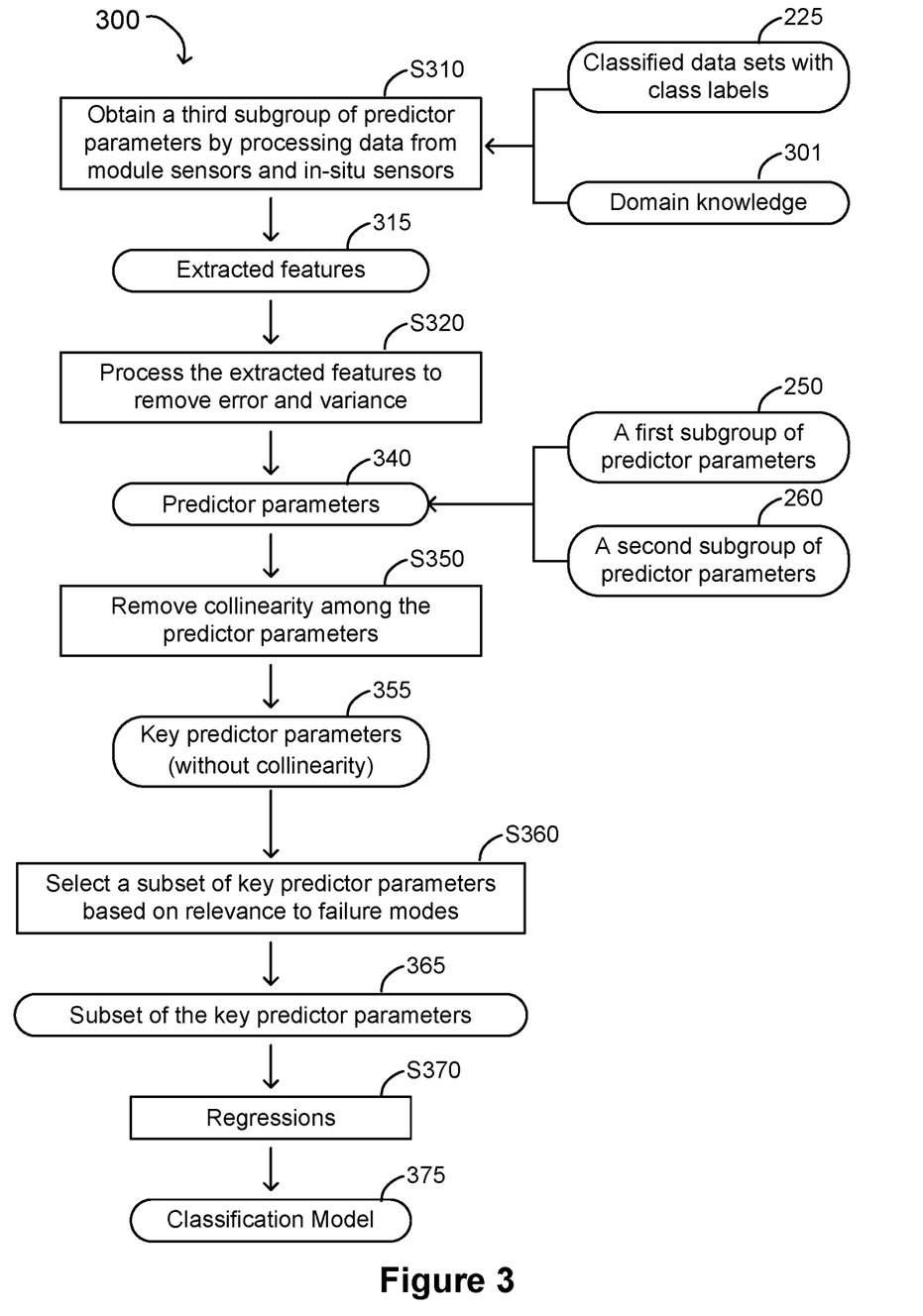
FIG. 3 shows a diagram of building a classification model, in accordance with exemplary embodiments of the present disclosure.

FIG. 3 shows a diagram of building a classification model, in accordance with exemplary embodiments of the present disclosure. Note that FIG. 3 herein is similar to but different from FIG. 3 in our previous patent application U.S. Ser. No. 17/025,651. Herein, domain knowledge 301 includes knowledge of a plasma tool, a plasma process executed by the plasma tool, metrology and/or the wafer. In some embodiments, knowledge of the plasma process includes physical characteristics, chemical characteristics and/or other information of the plasma process, such as atomic and molecular dissociation in plasma, a surface reaction model, and plasma diagnostics. Knowledge of the plasma tool includes a recipe for the plasma process, information of a plasma chamber and/or other information related to the plasma tool, such as parameters controlled by module sensors of the plasma tool. Knowledge of metrology includes in-situ metrology (e.g. sensors), ex-situ metrology (e.g. atomic force microscopy) and/or characterization data obtained by the in-situ and ex-situ metrology. Knowledge of the wafer includes various information regarding the wafer, such as characterization data obtained by the in-situ and ex-situ metrology. Domain knowledge can be obtained by acquiring prior knowledge in literature, common knowledge within a plasma industry/academia, professional knowledge of a plasma expert and the like. Particularly, in a plasma etching process, domain knowledge can include etching mechanism, plasma chamber information, recipe information, wafer information, depth measurement method information and/or the like.

At Step S310, a third subgroup of predictor parameters is obtained by processing data from module sensors and in-situ sensors. Herein, the classified data sets with class labels 225 from FIG. 2 and the domain knowledge 301 are both used to help process the data. The classified data sets with class labels 225 contain information pertaining to failure modes. The domain knowledge 301 can be used, for example, for fault tree analysis (FTA).

The obtained third subgroup of predictor parameters is also referred to as extracted features 315. In a non-limiting example of a plasma etching process, the data from the module sensors and the in-situ sensors include time trace data of a gas flow rate and an optical emission spectrum, both of which are recorded during the course of the plasma etching process. The time trace data are then processed so as to have physical or chemical meanings related to the plasma etching process. In an embodiment, a mean gas flow rate is obtained by calculating the time average gas flow rate and provides information about average etching conditions. In another embodiment, emergence or disappearance of a certain peak in the optical emission spectrum may indicate the onset or endpoint of an etching reaction.

As shown in FIG. 3, the exacted features 315 are then processed to remove errors and variance at Step S320. For example, outliers (data points deviate significantly from mean trend) and parameters with small variations can be removed at this step. The processed exacted features are then added to predictor parameters 340, along with the first subgroup of predictor parameters 250 and the second subgroup of predictor parameters 260.

At Step S350, collinearity is removed among the predictor parameters 340. Collinearity removal is accomplished by calculating correlations between one predictor parameter and other predictor parameters, and then grouping predictor parameters based on correlations. In other words, one or more predictor parameters are grouped together with respective correlations meeting a threshold requirement. Subsequently, a representative predictor parameter is selected from each group to form key predictor parameters 355 so that the key predictor parameters 355 have no collinearity with one another. The key predictor parameters 355 can thus have fewer parameters than the predictor parameters 340.

In some embodiments, the aforementioned three subgroups of predictor parameters (e.g. the first subgroup of predictor parameters 250, the second subgroup of predictor parameters 260 and the processed extracted features) can be assigned different priorities. For example, the representative predictor parameters can be selected in order of priority: the second subgroup (a high priority), the first subgroup (a medium priority) and the third subgroup (a low priority). Therefore, parameters from a subgroup of a higher priority (e.g. the second subgroup) are more likely to be selected as one of the key predictor parameters than parameters from a subgroup of a lower priority (e.g. the third subgroup). In other words, parameters from a subgroup of a lower priority (e.g. the third subgroup) are more likely to be removed than parameters from a subgroup of a higher priority (e.g. the second subgroup). In some embodiments, a ranking system may be implemented within one or more subgroups of the predictor parameters 340.

At Step S360, a subset of key predictor parameters 365 is selected based on relevance to failure modes. For example, the subset of key predictor parameters 365 can be selected based on correlations with the classified data sets with class labels 225. Specifically, the correlations between a key predictor parameter and the classified data sets with class labels 225 are calculated, and the key predictor parameter that meets a correlation threshold requirement is then included in the subset of key predictor parameter 365. Alternatively, partial least squares, random forest, gradient boost or the like can be used to determine relevance of predictor parameters to the metrology data. As a result, the correlation threshold requirement can remove one or more of the subset of key predictor parameters to which the failure modes are insensitive.

At Step S370, regression analysis is performed using one or more regression models based on the subset of the key predictor parameters 365. The one or more regression models may include a logistic regression, a support vector machine (SVM) regression, a regression tree analysis, an exhaustive linear model with highest importance predictors, regularized linear regression (Lasso), forward stepwise selection with known parameters and/or the like. As a result, a classification model 375 is built. The classification model 375 can be used to identify a plurality of failure modes of the plasma tool. In one embodiment, the classification model 375 includes a plurality of fault detection models, each of which can detect one failure mode. In another embodiment, the plurality of fault detection models is integrated into a single multi-class classification model by applying a machine learning algorithm. Additionally, in some embodiments, the classification model 375 corresponds to the classification model in FIG. 1.

Figure 4:
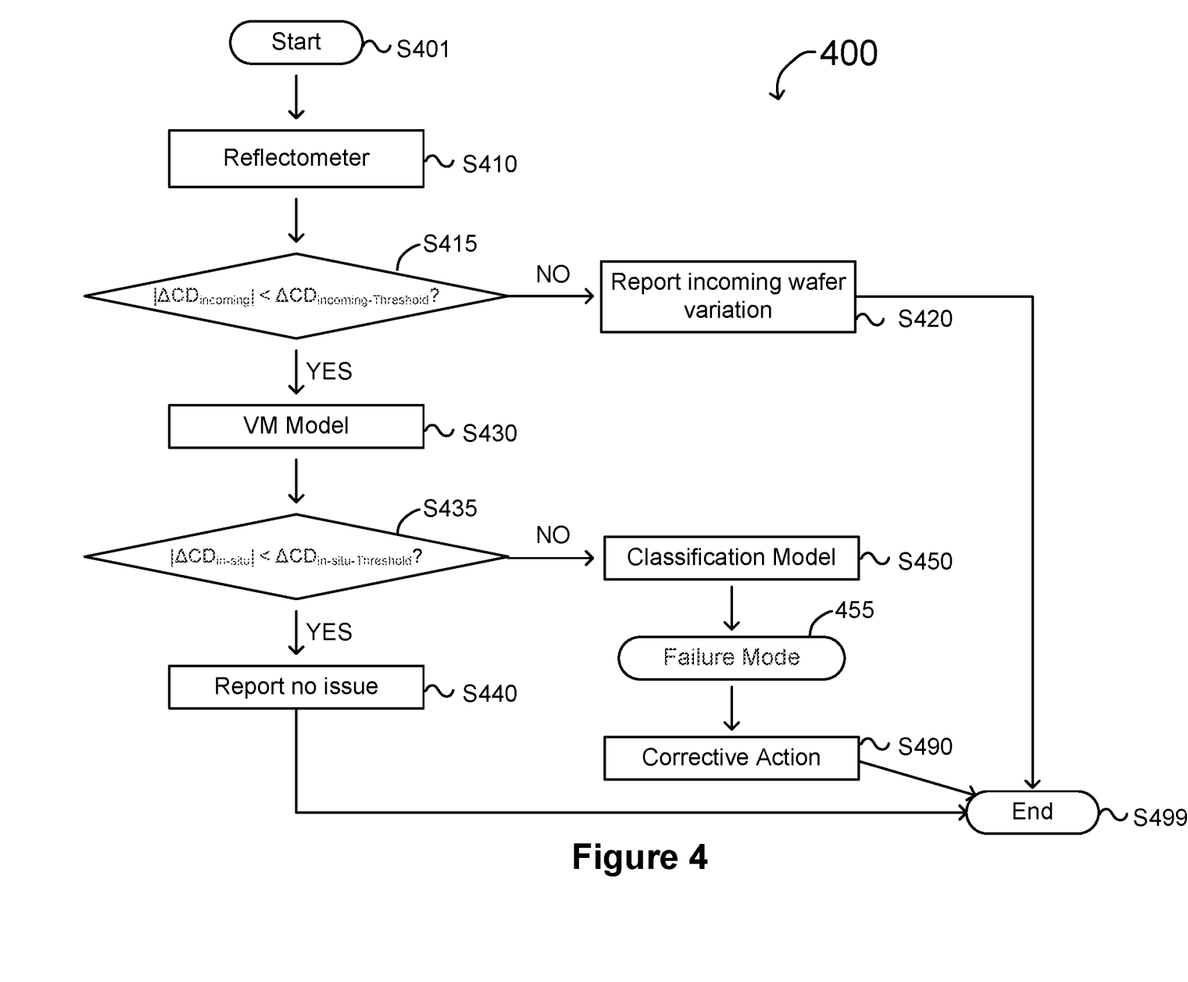
FIG. 4 shows a diagram of a process for troubleshooting a plasma tool, in accordance with exemplary embodiments of the present disclosure.

FIG. 4 shows a diagram of a process 400 for troubleshooting a plasma tool, in accordance with exemplary embodiments of the present disclosure. A user of the plasma tool may report a problem when a defect occurs in a product of the plasma tool. In a non-limiting example, post-etch CD, ER or yield does not conform to specifications after performing a plasma etching process using the plasma tool. To evaluate tool health of the plasma tool, an initial test is performed on an incoming wafer to determine whether the incoming wafer meets a preset requirement.

In some embodiments, performing the initial test is accomplished by measuring a reflectivity of the incoming wafer using a reflectometer at Step S410. The reflectometer can be installed in situ or integrated with ex-situ metrology. A test model is provided that predicts a target wafer characteristic based on the reflectivity. The test model can be obtained from a third party or built by oneself. In a non-limiting example, the test model is a VM model that predicts CD based on the reflectivity. The incoming wafer meets the preset requirement when the CD predicted by the test model is within a preset range of CD. For example, the user may optionally calculate $\Delta CD_{incoming} = CD_{incoming} - CD_{Incoming-target}$ at Step S415, where $CD_{incoming}$ is a CD predicted by the test model and $CD_{Incoming-target}$ is a target CD. Accordingly, the incoming wafer meets the preset requirement when $|\Delta CD_{incoming}| < \Delta CD_{incoming\text{-}Threshold}$, where $\Delta CD_{incoming\text{-}Threshold}$ is a preset threshold value corresponding to the preset range of CD. In alternative embodiments, the target CD, the preset range of CD and the test model may be used to back-calculate a target reflectivity and a preset range of the reflectivity. Accordingly, the incoming wafer meets the preset requirement when the reflectivity of the incoming wafer is within the preset range of the reflectivity. For example, the user may optionally calculate $\Delta RF_{incoming} = RF_{incoming} - RF_{Incoming\text{-}target}$ at Step S415, where $RF_{incoming}$ is a reflectivity of the incoming wafer and $RF_{Incoming\text{-}target}$ is the target reflectivity. Accordingly, the incoming wafer meets the preset requirement when $|\Delta RF_{incoming}| < \Delta RF_{incoming\text{-}Threshold}$, where $\Delta RF_{incoming\text{-}Threshold}$ is a preset threshold value corresponding to the preset range of the reflectivity.

When the incoming wafer does not meet the preset requirement, i.e. $|\Delta CD_{incoming}| \geq \Delta CD_{incoming\text{-}Threshold}$ (or $|\Delta RF_{incoming}| \geq \Delta RF_{incoming\text{-}Threshold}$), Step S420 is executed where incoming wafer variation is reported. In other words, the incoming wafer deviates significantly from average or standard wafers and thus is a source of the problem.

When the incoming wafer meets the preset requirement, i.e. $|\Delta CD_{incoming}| < \Delta CD_{incoming\text{-}Threshold}$ (or $|\Delta RF_{incoming}| < \Delta RF_{incoming\text{-}Threshold}$), the process 400 proceeds to Step S430 where a VM model that is provided or pre-built is used to predict the wafer characteristic (e.g. CD). The VM model herein corresponds to the VM model at Step S110 in FIG. 1. Descriptions have been provided above and will be omitted here for simplicity purposes.

Next, whether the predicted wafer characteristic is within a pre-determined range is determined at Step S435. In a non-limiting embodiment, $\Delta CD_{in\text{-}situ}$ is calculated according to a formula: $\Delta CD_{in\text{-}situ} = CD_{in\text{-}situ} - CD_{in\text{-}situ\text{-}Target}$, where $CD_{in\text{-}situ}$ is a CD predicted by the VM model using data collected by in-situ sensors and $CD_{in\text{-}situ\text{-}Target}$ is a target CD. Similarly, $|\Delta CD_{in\text{-}situ}|$ is then compared with $\Delta CD_{in\text{-}situ\text{-}threshold}$, which is a pre-determined threshold value.

If $|\Delta CD_{in\text{-}situ}| < \Delta CD_{in\text{-}situ\text{-}threshold}$, the VM mode is considered valid. Thus, Step S440 is executed where no issue is reported. Under this circumstance, the user might need to troubleshoot other processes associated with the plasma process to identify the source(s) of the problem. For example, a semiconductor tool that is used prior to the plasma process may have caused the problem without inducing the incoming wafer to fail the initial test or invalidating the VM model.

If $|\Delta CD_{in\text{-}situ}| \geq \Delta CD_{in\text{-}situ\text{-}threshold}$, the VM mode is considered invalid or out of date, indicating an appreciable change in the plasma tool. In other words, there is at least one failure mode 455. Consequently, the process 400 proceeds to Step S450 by using a classification model to identify the at least one failure mode 455. The classification model herein corresponds to the classification model at Step S120 in FIG. 1 and can be built in accordance with in FIGS. 2 and 3. Subsequently, at least one corrective action 490 is taken to address the at least one failure mode 455. In some embodiments, a list of probable failure modes is identified by the classification model, and corrective actions are taken accordingly.

Note that the process 400 herein may include embodiments of the process 100 in FIG. 1. Also, in some embodiments, a different plasma process is executed in the plasma tool. In some embodiments, another suitable initial test is performed to evaluate the incoming wafer. Further, the VM model can predict any wafer characteristic that is important to the plasma process.

Figure 5:
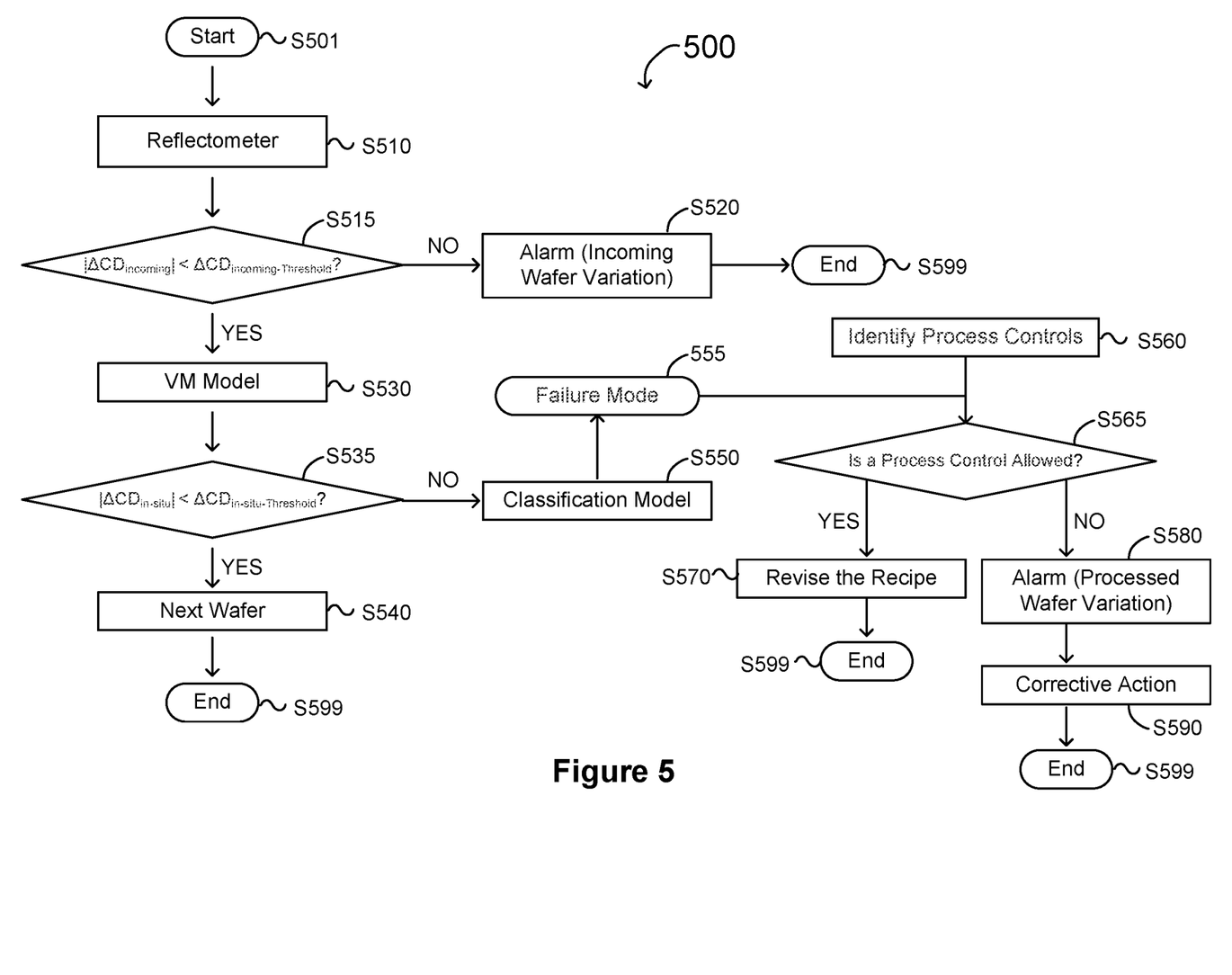
FIG. 5 shows a diagram of a process for tool health monitoring and classification, in accordance with exemplary embodiments of the present disclosure.

FIG. 5 shows a diagram of a process 500 for tool health monitoring and classification, in accordance with exemplary embodiments of the present disclosure. As noted in the Background, a plasma tool often requires constant monitoring and correction to maintain the health of the plasma tool. At any point of manufacturing, the plasma tool may go through the process 500 for fault detection purposes. Since the embodiment of the process 500 is similar to the embodiment of the process 400 (particularly, S5XX or 5XX in FIG. 5 corresponds to S4XX or 4XX in FIG. 4), descriptions herein will be focused on differences.

As illustrated, at Step S515, if the incoming wafer does not meet the preset requirement, i.e. $|\Delta CD_{incoming}| \geq \Delta CD_{incoming\text{-}Threshold}$ (or $|\Delta RF_{incoming}| \geq \Delta RF_{incoming\text{-}Threshold}$), Step S520 is executed where an alarm about incoming wafer variation is posted. In this case, the user might need to check the quality of the batch of wafers where the incoming wafer is from.

At Step S535, if $|\Delta CD_{in\text{-}situ}| < \Delta CD_{in\text{-}situ\text{-}threshold}$, the VM mode is considered valid, and the tool is therefore considered "healthy". Thus, Step S540 is executed by moving forward to the next wafer.

When at least one failure mode 555 is identified by the classification model, Step S560 is executed where process controls for failure modes are identified so that whether a failure mode allows for a process control is determined at Step S565.

If a failure mode allows for one or more process controls, Step S570 is executed where a recipe for the tool is revised. In a non-limiting example, the plasma tool has a worn part such as an upper electrode that is old and has some wear. Instead of replacing the upper electrode forthwith or on a regular basis, the user may choose to adjust recipe parameters so that the plasma tool continues to operate without incurring an extra expenditure on buying, installing and tuning a replacement electrode.

If a failure mode does not allow for any process control, an alarm for processed wafer variation may be optionally posted at Step S580. Also, a list of highly probable failure modes may be optionally determined. More importantly, at Step S590, at least one corrective action is taken to address the failure mode. In one example, the failure mode includes deposition on a chamber wall, and the corrective action includes seasoning to reset the chamber. In another example, the failure mode includes radio frequency (RF) generator power output, and the corrective action includes RF generator service.

Similar to the process 400 in FIG. 4, the process 500 herein may include embodiments of the process 100 in FIG. 1. Besides, in some embodiments, a different plasma process is executed in the plasma tool. In some embodiments, another suitable initial test is performed to evaluate the incoming wafer. Further, the VM model can predict any wafer characteristic that is important to the plasma process.

The various embodiments described herein offer several advantages. Firstly, a VM model is integrated to define "tool health". In-situ sensors data are integrated into the VM model for improving classification accuracy. Secondly, a classification model is developed to define various failure modes, some of which can be easily corrected by merely twiddling a few control knobs. Additionally, an incoming wafer test, such as reflectometer measurement which is simple and facile, enables more accurate run-to-run process control for variability reduction.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of evaluating tool health of a plasma tool, the method comprising:
    providing a classification model that identifies a plurality of failure modes of the plasma tool;
    performing an initial test on an incoming wafer by performing a measurement on the incoming wafer;
    determining that the incoming wafer meets a preset requirement based on the initial test, in response to determining that the incoming wafer meets a preset requirement based on the initial test, executing a plasma etching process, and predicting a wafer characteristic associated with the plasma etching process using a virtual metrology (VM) model that is configured to predict the wafer characteristic based on parameters measured by module sensors and in-situ sensors of the plasma tool;
    determining that the wafer characteristic predicted by using the VM model is outside a pre-determined range and identifying a current failure mode using the classification model; and
    based on the current failure mode, adjusting a recipe of the plasma etching process or taking a corrective action for the plasma tool.

2. The method of claim 1, wherein providing the classification model comprises:
    determining predictor parameters;
    removing collinearity among the predictor parameters to obtain key predictor parameters;
    selecting a subset of the key predictor parameters based on relevance to the plurality of failure modes; and
    building the classification model using the subset of the key predictor parameters.

3. The method of claim 2, wherein determining the predictor parameters comprises:
    determining target wafer characteristics; and
    determining failure modes for the target wafer characteristics based on occurrence and sensitivity of the failure modes so that the parameters from the module sensors and the in-situ sensors are classified into different categories for the failure modes.

4. The method of claim 3, wherein a fault detection model is, constructed with one or more parameters from the module sensors without using parameters from the in-situ sensors, the method further comprising adding the one or more parameters from the module sensors to a first subgroup of predictor parameters.

5. The method of claim 4, wherein building a fault detection model entails using one or more parameters from the in-situ sensors, the method further comprising adding the one or more parameters from the in-situ sensors to a second subgroup of predictor parameters.

6. The method of claim 5, wherein determining the predictor parameters further comprises:
    obtaining a third subgroup of predictor parameters by processing the parameters from the module sensors and the in-situ sensors using domain knowledge including knowledge of the plasma tool, a plasma process associated with the plasma tool, metrology and/or the wafer; and
    processing the third subgroup of predictor parameters to remove error and variance.

7. The method of claim 5, further comprising building a VM model associated with a failure mode using the second subgroup of predictor parameters.

8. The method of claim 5, wherein the classification model comprises a plurality of fault detection models.

9. The method of claim 5, further comprising integrating a plurality of fault detection models into a single multi-class classification model by applying a machine learning algorithm.

10. The method of claim 2, wherein providing the classification model using the subset of the key predictor parameters comprises regression analysis that includes at least one of a logistic regression, a support vector machine regression, a decision tree regression or a linear regression.

11. The method of claim 1, wherein performing the initial test comprises:
    measuring a reflectivity of the incoming wafer;
    providing a test model that predicts the wafer characteristic based on the reflectivity; and
    predicting the wafer characteristic using the test model.

12. The method of claim 11, wherein the incoming wafer meets the preset requirement when the wafer characteristic predicted by using the test model is within a preset range.

13. The method of claim 1, wherein the current failure mode allows for a process control, and the recipe of the plasma etching process is adjusted.

14. The method of claim 13, wherein the current failure mode comprises a worn part of the plasma tool.

15. The method of claim 1, wherein the current failure mode does not allow for a process control, and the corrective action is taken.

16. The method of claim 15, wherein:
the failure mode includes deposition on a chamber wall, and
the corrective action includes seasoning to reset the chamber.

17. The method of claim 15, wherein:
the failure mode includes radio frequency (RF) generator power output, and
the corrective action includes RF generator service.

18. The method of claim 1, wherein the module sensors include at least one of a pressure manometer, a gas flow meter or RF power meter.

19. The method of claim 1, wherein the in-situ sensors include at least one of a reflectometer, a plasma sensor, an RF sensor or a voltage and current (VI) sensor.

20. The method of claim 1, further comprising determining that the wafer characteristic predicted by using the VM model is within the pre-determined range, and continuing to process a new wafer.

21. The method of claim 1, wherein the wafer characteristic is selected from the group consisting of a critical dimension (CD), an etch rate (ER), particles and defects.

* * * * *